(12) United States Patent
Lim et al.

(10) Patent No.: US 8,465,662 B2
(45) Date of Patent: Jun. 18, 2013

(54) COMPOSITION FOR WET ETCHING OF SILICON DIOXIDE

(75) Inventors: Jung Hun Lim, Daejeon (KR); Dae Hyun Kim, Gongju-si (KR); Chang Jin Yoo, Gongju-si (KR); Seong Hwan Park, Cheongju-si (KR)

(73) Assignee: Techno Semichem Co., Ltd., Seongnam-si (KR)

( * ) Notice: Subject to any disclaimer, the term of this patent is extended or adjusted under 35 U.S.C. 154(b) by 281 days.

(21) Appl. No.: 12/887,026

(22) Filed: Sep. 21, 2010

(65) Prior Publication Data

US 2012/0070998 A1 Mar. 22, 2012

(51) Int. Cl.
*C03C 15/00* (2006.01)

(52) U.S. Cl.
USPC .......... 216/99; 216/96; 216/97; 216/98; 252/79.1; 252/79.3; 252/79.4; 438/756

(58) Field of Classification Search
None
See application file for complete search history.

(56) References Cited

U.S. PATENT DOCUMENTS

| 2010/0035436 A1* | 2/2010 | Kim et al. ............... 438/756 |
| 2010/0112728 A1* | 5/2010 | Korzenski et al. ......... 438/3 |

* cited by examiner

*Primary Examiner* — Lan Vinh
*Assistant Examiner* — Jiong-Ping Lu
(74) *Attorney, Agent, or Firm* — The Webb Law Firm

(57) ABSTRACT

Provided is an etching composition for electively removing silicon dioxide at a high etch rate, more particularly, a composition for wet etching of silicon dioxide, including 1 to 40 wt % of hydrogen fluoride (HF); 5 to 40 wt % of ammonium hydrogen fluoride ($NH_4HF_2$); and water, and further including a surfactant to improve selectivity of the silicon dioxide and a silicon nitride film. Since the composition for wet etching of silicon dioxide has the high etch selectivity of the silicon dioxide to the silicon nitride film, it is useful for selectively removing silicon dioxide.

4 Claims, No Drawings

COMPOSITION FOR WET ETCHING OF SILICON DIOXIDE

TECHNICAL FIELD

The following disclosure relates to an etching composition for electively removing silicon dioxide at a high etch rate, and in particular, to a composition for wet etching of silicon dioxide, which has a high etch selectivity to a silicon nitride film and is proper to a wet etching process of a single type on a large substrate by removing the silicon dioxide at high etch rate.

BACKGROUND

Recently, a batch type is generally adopted instead of a single type in a semiconductor cleaning process. The single type, which uses a method of processing a sheet after another of wafer, has a lot of advantages in comparison with the batch type. That is, since new chemical can be supplied every process and there is no influence by other wafers, it is possible to solve the problem of particles reattachment. In addition, since the wafer performs a rinse process while rotating without moving after the chemical process, the chemical liquid is well replaced.

The cleaning process of the single type requires a small area in installing equipments, has a fast process speed, perform uniform etching, and has improved responding performance in process. However, it has a disadvantage in productivity and consumption of chemical since a sheet after another is processed.

Buffered Oxide Etchant (BOE) is known as a representative conventional wet etchant for removing silicon dioxide. The conventional BOE is an etchant containing ammonium fluoride ($NH_4F$) and hydrogen fluoride (HF) as a fluorine compound and having selectivity of silicon dioxide (TEOS) to the silicon nitride film of 50 or higher, preferably 140.

The conventional BOE using ammonium fluoride ($NH_4F$) and hydrogen fluoride (HF) as the fluorine compound controls a content by increasing the content of hydrogen fluoride (HF) or ammonium fluoride ($NH_4F$). However, increasing a weight ratio of hydrogen fluoride (HF) and ammonium fluoride ($NH_4F$) causes a problem of Solid Phase Segregation of ammonium fluoride ($NH_4F$). The problem of Solid Phase Segregation of BOE occurs when the concentration of hydrogen fluoride and ammonium fluoride is increasing. Solid Phase Segregation may occur at 20° C. or higher when the temperature of Solid Phase Segregation is high. Since Solid Phase Segregation occurring at 20° C. or higher causes a problem in a process temperature, transport and storage, there are many difficulties in usage. There is also a problem that Solid Phase Segregation of ammonium fluoride ($NH_4F$) in a spray nozzle due to a sublimation property of ammonium fluoride ($NH_4F$) may contaminate particles.

Therefore, a composition for wet etching that selectively removes silicon dioxide for a short time at a high etch rate on silicon dioxide and a low etch rate on the silicon nitride film existing on a substrate in a process of preparing a semiconductor is required to apply the conventional BOE to the wet etching process.

SUMMARY

An embodiment of the present invention is directed to providing a composition for wet etching that usefully removes silicon dioxide of a large substrate by high etch selectivity to a silicon nitride film and a high etch rate to silicon dioxide.

To be specific, an embodiment of the present invention is directed to providing a composition for wet etching of silicon dioxide that the etch selectivity of silicon dioxide (TEOS) to the silicon nitride film is 150, more preferably 200 or higher.

In order to solve the technical problem, provided is a composition for wet etching that selectively removes silicon dioxide at a high etch rate.

To be specific, a composition for wet etching of silicon dioxide includes 1 to 40 wt % of hydrogen fluoride (HF), 5 to 40 wt % of ammonium hydrogen fluoride ($NH_4HF_2$) and water, and selectively further includes 0.001 to 5 wt % of anionic surfactant and 0.001 to 5 wt % of an etching accelerator of silicon dioxide.

The etch selectivity (TEOS/SiN) of silicon dioxide (TEOS) to silicon nitride film (SiN) is 150 or higher, more preferably 170 or higher and an etch rate of silicon dioxide (TEOS) is 10000 Å/min or higher, more preferably 15000 Å/min or higher.

Since the composition for wet etching according to the present invention achieves the high etch rate in comparison with an conventional wet etchant and has the high etch selectivity (TEOS/SiN) of silicon dioxide (TEOS) to silicon nitride film (SiN), it is possible to reduce a process time for etching silicon dioxide by a single type process and solve a problem of reduction in productivity as a disadvantage of the single type process.

The present invention will be described in detail hereinafter.

The conventional wet etchant is an etchant containing ammonium fluoride ($NH_4F$) and hydrogen fluoride (HF) as a fluorine compound. The conventional etchant increases the content of hydrogen fluoride (HF) or ammonium fluoride ($NH_4F$) to improve an etch rate but it causes a problem in stability of the etchant and contamination of particles due to Solid Phase Segregation. Accordingly, it has a limitation that the selectivity of silicon dioxide (TEOS) to the silicon nitride film becomes 50, more preferably 140.

The wet etchant according to the present invention is a composition that increases the etch rate of silicon dioxide and simultaneously has the high etch selectivity of silicon dioxide (TEOS) to the silicon nitride film. The wet etchant contains 1 to 40 wt % of hydrogen fluoride (HF), 5 to 40 wt % of ammonium hydrogen fluoride ($NH_4HF_2$) and water and selectively further includes 0.001 to 5 wt % of an anionic surfactant and 0.001 to 5 wt % of a silicon dioxide etching accelerator.

The wet etchant according to the present invention surprisingly increases the selectivity of silicon dioxide (TEOS) to the silicon nitride film by including 1 to 40 wt % of hydrogen fluoride (HF) and 5 to 40 wt % of ammonium hydrogen fluoride ($NH_4HF_2$) as a fluorine compound. In addition, the wet etchant increases the etch rate of silicon dioxide to reduce a process time in the single type process.

When the content of the hydrogen fluoride and the ammonium hydrogen fluoride is out of the range, the etch rate of silicon dioxide may be lowered. Accordingly, it is preferred to maintain the range. It is more preferable to maintain a sum of the hydrogen fluoride content and the ammonium hydrogen fluoride content at 50 wt % or higher based on the total weight of the composition. It is because when the sum of the hydrogen fluoride content and the ammonium hydrogen fluoride content is 50 wt % or less, the etch rate of silicon dioxide may not be sufficiently high thereby reducing productivity in the single type process. It is more preferably that the composition for wet etching includes 10 to 30 wt % of hydrogen fluoride (HF) and 30 to 40 wt % of ammonium hydrogen fluoride ($NH_4HF_2$).

A surfactant contained in the composition for wet etching plays a role of improving the etch selectivity of silicon dioxide to the silicon nitride film in comparison with the conventional composition for wet etching and is preferably used at 0.001 to 5 wt %, more preferably 0.001 to 1 wt % based on the total weight of the composition. When the content is 0.001 wt % or less, the etch selectivity of the silicon dioxide to the silicon nitride film does not show an obvious increase in the etch selectivity of the silicon dioxide to the silicon nitride film. When the content exceeds by 5 wt %, the content of other elements comparatively decreases to influence an etching property.

Examples of the anionic surfactant include a material having a linear (C1~C20) alkyl group especially in alkylbenzene sulfonate, a material having a (C1~C20) alkyl group especially in primary and secondary alkyl sulfate, a material having a (C1~C20) alkyl group especially in alkyl ether sulfate, alkoxylated amide, olefin sulfonate, alkyl xylene sulfonate, dialkyl sulfosuccinate, fatty acid ester sulfonate, a material having a (C1~C20) alkyl group especially in primary and secondary alcohol sulfate, glutamate, isethionate, phosphate, taurate, alkoxylated alcohol or alkyl carboxylate compounds. A format of the anionic surfactant is any one selected from the group consisting of an ammonium format, a sodium salts format, a potassium salts foimat, an acid format and a combination format thereof. When ammonium, sodium salts and potassium salts of the anionic surfactant are raw materials of the surfactant, the surfactant is entirely or partially neutralized by acid and may be used as a mixture of ammonium, sodium salts, potassium salts and acid. It is the most preferably to use ammonium polyoxyethylene (C1~C20) alkyl sulfate.

Alcohols may be selectively used as an etching accelerator for improving etch selectivity of the silicon dioxide to the silicon nitride film. It is preferred to use alcohols of 0.001 to 5 wt %, more preferably 0.01 to 5 wt % based on the total weight of the composition. When the content is 0.001 wt % or less, the etch selectivity of the silicon dioxide to the silicon nitride film does not show the obvious increase. When the content exceeds 5 wt %, the content of other elements comparatively decreases to influence the etching properties. Examples of the alcohols as (C1~C10) alcohol compounds include methanol, ethanol, isopropyl alcohol, butanol, pentanol, hexanol, heptanol or a mixture thereof.

More preferred wet etchant according to the present invention includes 10 to 30wt % of hydrogen fluoride (HF), 30 to 40 wt % of ammonium hydrogen fluoride ($NH_4HF_2$), 0.001 to 1 wt % of ammonium polyoxyethylene (C1~C20) alkyl sulfate as an anionic surfactant and water. A sum of the hydrogen fluoride content and the ammonium hydrogen fluoride content is 50 to 70 wt % based on the total weight of the composition. In addition, when an etching accelerator selected from the group consisting of methanol, ethanol, isopropyl alcohol, butanol, pentanol, hexanol, heptanol and a mixture thereof is further contained at an amount of 0.01 to 5 wt % based on the total weight of the composition, it is possible to improve the etch rate and etch selectivity (TEOS/SiN) of silicon dioxide.

Provided is a method for removing silicon dioxide by wet etching on a substrate for semiconductor preparation, in which silicon dioxide exists, by using the silicon dioxide composition for wet etching.

Since the silicon dioxide composition for wet etching according to the present invention can reduce a process time through application to a single type cleaning device in the semiconductor preparing process in comparison with the conventional composition for wet etching, productivity can be increased in the single type process.

Also, since the silicon dioxide composition for wet etching has the high etch selectivity of the silicon dioxide to the silicon nitride film as well as the high etch rate to the silicon dioxide, it is proper to be applied to selectively remove only silicon dioxide from the substrate for semiconductor preparation, in which the silicon nitride film and the silicon dioxide coexist.

Other features and aspects will be apparent from the following detailed description and the claims.

DETAILED DESCRIPTION OF EMBODIMENTS

Hereinafter, the present invention will be described in detail with reference to Examples. However, it is apparent to those skilled in the art that Examples are not intended to limit the scope of the invention but are provided for the sake of easy understanding on the configuration and effect of the invention.

EXAMPLE

An etchant containing elements shown in Table 1 below and water was prepared. In Table 1, ammonium polyoxyethylene (C1~C20) alkyl sulfate was used as an anionic surfactant.

According to an etching process, when each of a silicon dioxide wafer and a silicon nitride film wafer was installed at an wet etching equipment of a single type, the etchant was introduced on silicon dioxide for 10 seconds and a silicon nitride film for 1 minute at a flow rate of 2 L/min while rotating the wafer at 200 rpm. Cleaning with deionized water and $N_2$ spin dry were followed.

COMPARATIVE EXAMPLE

A composition for etching was prepared by varying its constitution as shown in Table 1 below and an etch rate was measured by etching the silicon dioxide and the silicon nitride film according to the same method as Example. As shown in the result of Table 1, the compositions of Comparative Example show a low etch rate or low etch selectivity of the silicon dioxide.

TABLE 1

| | | | | | | | |
|---|---|---|---|---|---|---|---|
| Etch Rate and Etch Selectivity (25° C.) Of Silicon Dioxide and Silicon Nitride Film ||||||||
| | | | Anionic | | Etch rate (ER) || Etch |
| Examples | | | surfactant (wt %) | Alcohol (wt %) | TEOS (Å/min) | SiN (Å/min) | Selectivity TEOS/SiN |
| | HF (wt %) | $NH_4HF_2$ (wt %) | | | | | |
| 1 | 20 | 30 | — | — | — | 20130 | 122 | 165 |
| 2 | 10 | 30 | 0.025 | — | — | 12471 | 42 | 297 |
| 3 | 10 | 40 | 0.025 | — | — | 16638 | 48 | 347 |
| 4 | 20 | 30 | 0.025 | | | 18678 | 64 | 292 |

TABLE 1-continued

Etch Rate and Etch Selectivity (25° C.) Of Silicon Dioxide and Silicon Nitride Film

| Examples | HF | NH4F | Anionic surfactant (wt %) | Alcohol | (wt %) | TEOS (Å/min) | SiN (Å/min) | Etch Selectivity TEOS/SiN |
|---|---|---|---|---|---|---|---|---|
| 5 | 30 | 30 | 0.025 | — | — | 33051 | 90 | 367 |
| 6 | 30 | 40 | 0.025 | Pentanol | 0.15 | 36240 | 90 | 402 |
| Comparative Example 1 | 50 | 0 | | | | 24020 | 260 | 92 |
| Comparative Example 2 | 30 | 20 | | | | 16500 | 165 | 100 |
| Comparative Example 3 | 20 | 20 | | | | 10300 | 110 | 94 |

With reference to the result of Table 1, when compared with the composition of Comparative Example, the composition for wet etching according to the present invention shows a very superior characteristic in processing the large substrate according to the single type due to the high etch selectivity of the silicon dioxide to the silicon nitride film.

Since the composition for wet etching of silicon dioxide has the high etch selectivity of the silicon dioxide to the silicon nitride film as well as the high etch rate on the silicon dioxide, it is proper to be applied to process the substrate for semiconductor preparation according to the single type process.

What is claimed is:

1. A composition for wet etching of silicon dioxide, comprising:
   10 to 30 wt % of hydrogen fluoride (HF), 30 to 40 wt % of ammonium hydrogen fluoride ($NH_4HF_2$), 0.001 to 1 wt % of ammonium polyoxyethylene (C1~C20) alkyl sulfate and water, wherein a sum of a hydrogen fluoride content and an ammonium hydrogen fluoride content is 50 to 70 wt % based on the total weight of the composition.

2. The composition for wet etching of silicon dioxide of claim 1, further comprising:
   an etching accelerator selected from (C1~C10) alcohol compounds of 0.001 to 5 wt % based on the total weight of the composition.

3. The composition for wet etching of silicon dioxide of claim 1, further comprising:
   an etching accelerator selected from the group consisting of methanol, ethanol, isopropyl alcohol, butanol, pentanol, hexanol, heptanol and a mixture thereof of 0.01 to 5 wt % based on the total weight of the composition.

4. A method for selectively removing silicon dioxide from a substrate, in which silicon dioxide is formed, by using the composition for wet etching of silicon dioxide according to claim 1, 2, or 3.

* * * * *